US007751470B2

(12) United States Patent
Stanton et al.

(10) Patent No.: US 7,751,470 B2
(45) Date of Patent: Jul. 6, 2010

(54) TIME CORRELATION OF SIGNAL POWER TO DISTORTION CHARACTERISTICS

(75) Inventors: Steven W. Stanton, Aloha, OR (US); John F. Turpin, Tigard, OR (US); Christopher D. Larson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 1415 days.

(21) Appl. No.: 11/053,156

(22) Filed: Feb. 7, 2005

(65) Prior Publication Data
US 2006/0176967 A1 Aug. 10, 2006

(51) Int. Cl.
*H04B 3/46* (2006.01)
*H04B 17/00* (2006.01)
*G01R 23/16* (2006.01)

(52) U.S. Cl. .................. 375/224; 375/225; 375/226; 375/227; 375/228; 702/67; 702/68; 702/69; 702/75; 702/76; 702/189; 702/190; 702/193

(58) Field of Classification Search .................. 375/260, 375/343, 346, 224–229; 702/67–79, 189–199
See application file for complete search history.

(56) References Cited

U.S. PATENT DOCUMENTS

| | | | | | |
|---|---|---|---|---|---|
| 4,703,433 | A | * | 10/1987 | Sharrit | 702/76 |
| 4,870,348 | A | * | 9/1989 | Smith et al. | 324/76.19 |
| 5,050,107 | A | * | 9/1991 | Cannon et al. | 358/1.3 |
| 5,075,618 | A | * | 12/1991 | Katayama | 324/76.27 |
| 5,103,402 | A | * | 4/1992 | Morton et al. | 702/76 |
| 5,724,388 | A | * | 3/1998 | Nagano et al. | 375/224 |
| 6,140,809 | A | * | 10/2000 | Doi | 324/76.24 |
| 6,377,617 | B1 | * | 4/2002 | Nara | 375/224 |
| 6,559,868 | B2 | * | 5/2003 | Alexander et al. | 715/781 |
| 6,671,334 | B1 | * | 12/2003 | Kuntz et al. | 375/340 |
| 6,681,191 | B1 | * | 1/2004 | Pickerd et al. | 702/76 |
| 6,768,293 | B2 | * | 7/2004 | Snaddon et al. | 324/76.19 |
| 6,847,905 | B2 | * | 1/2005 | Etheridge et al. | 702/67 |
| 7,142,609 | B2 | * | 11/2006 | Terreault et al. | 375/261 |
| 2003/0053532 | A1 | * | 3/2003 | Cutler et al. | 375/224 |
| 2003/0165205 | A1 | * | 9/2003 | Chu et al. | 375/346 |
| 2004/0125742 | A1 | * | 7/2004 | Schmidt | 370/208 |

OTHER PUBLICATIONS

Agilent "89600 Series Vector Signal Analyzers", Feb. 22, 2004.*
Agilent Vector Signal Analysis Basics Application Note 150-15 published Jul. 14, 2004.*

* cited by examiner

*Primary Examiner*—Mohammad H Ghayour
*Assistant Examiner*—Sophia Vlahos
(74) *Attorney, Agent, or Firm*—Francis I. Gray; Michael A. Nelson

(57) ABSTRACT

Time correlation of signal to distortion characteristics is achieved by acquiring time domain data for a frequency band representing a communication signal, the communication signal having multiple channels. The time domain data is simultaneously converted to frequency and demodulation domain data in sequential time blocks. The frequency and demodulation domain data are processed to obtain respectively frequency and demodulation domain measurements. The resulting measurements are displayed simultaneously as a function of time for all the time blocks and/or for a selected one of the time blocks. An ACLRogram display provides a display having a time axis and a frequency axis in the form of bars spanning the frequency band for each time block with each bar being divided into frequency sub-bands representing a main channel and adjacent side channels, the shading of each segment of the bar representing a measurement value for that segment.

5 Claims, 2 Drawing Sheets

TIME CORRELATION OF SIGNAL POWER TO DISTORTION CHARACTERISTICS

BACKGROUND OF THE INVENTION

The present invention relates to digital signal measurements, and more particularly to a time correlated display of signal power to distortion characteristics for a time-variant signal.

Traditional swept spectrum analyzers measure the characteristics of a signal by sweeping a frequency band of interest across a fixed receiver circuit. This results in an average power measurement for each point in the display, which is then integrated over sub-bands of interest. The sub-bands of interest may represent channel power and adjacent channel power measurements for a multi-channel communication signal. This method results in measurement variations and inaccuracies due to the time-varying nature of the signal being measured. Since distortion products from a power amplifier or other non-linear equipment are directly related to the amount of input signal power, it is critical for an amplifier manufacturer to measure both signal power and signal distortion characteristics over a common time interval. New models of spectrum analyzers, such as the Tektronix RSA and WCA Series spectrum analyzers, the Agilent PSA Series spectrum analyzers and the Rohde & Schwartz FSQ Series signal analyzers, either have or soon may have the ability to measure an entire band of interest in a single time-domain acquisition and perform ACLR (Adjacent Channel Leakage Ratio) and ACPR (Adjacent Channel Power Ratio) measurements mathematically. These measurements are the ratio of the power in the main signal to the power appearing in some adjacent signal band. However these new models do not analyze correlated values for other measurements, or provide a display of the time period over which the ACLR/ACPR was measured.

In addition to ACLR/ACPR, PAR (Peak to Average Ratio) and CCDF (Complementary Cumulative Distribution Function) measurements are important. The PAR measurement is made by forming a ratio of the peak input signal power to the average power over a specified time interval. The CCDF (Complementary Cumulative Distribution Function) measurement represents the probability that the peak power above average power of input signals exceeds a threshold. PAR and CCDF are measured by existing instruments and one instrument, the Agilent 89600 Series, can correlate PAR and CCDF over the same acquisition window. However this instrument does not relate these results to the ACLR/ACPR measurement. Other measurements, including code domain power (CDP)—the power contained in each of several orthogonally coded signals within an RF carrier—and EVM (Error Vector Magnitude)—the calculation of the length of an error vector resulting from the modulation of a carrier—are also used in conjunction with ACLR/ACPR to "trade off" performance in one domain vs. performance in another. In other words current instrument do not allow these measurements to be time correlated to ACLR/ACPR. The result is that measurement of characteristics of non-linear RF products in response to a known test signal require looking at different screen displays, each screen display representing a different measurement based upon a different time interval. The present instruments only allow the measurements to be observed time sequentially.

As signal characteristics change with time, ACLR/ACPR and other measurements on separate sets of data result in poor repeatability of the measurements. If the PAR of the signal is high during measurement of the adjacent channel and low during the measurement of the main channel, an artificially low ACPR measurement results. If these conditions are reversed in the next measurement, an artificially high figure is measured. Since the ACLR/ACPR measurements are not correlated to the PAR and CCDF measurements, results cannot be compared between successive measurements. The effects of signal variations over time may be reduced by applying averaging techniques to the data, but this creates unacceptably long measurement times and only reduces the inaccuracy—it does not eliminate it.

What is desired is a measurement of signal to distortion characteristics that results in higher accuracy, greater repeatability and faster measurements than the current uncorrelated measurement methods by looking at multiple measurements simultaneously.

BRIEF SUMMARY OF THE INVENTION

Accordingly the present invention provides time correlation of signal power to distortion characteristics for a digital signal, such as a communication signal having multiple channels. Time domain data for a frequency band representing the communication signal is acquired. The time domain data is simultaneously converted to frequency and demodulation domain data in sequential time blocks. The frequency and demodulation domain data are processed to obtain respectively frequency and demodulation domain measurements. The resulting measurements are displayed simultaneously as a function of time for all the time blocks and/or for a selected one of the time blocks. An ACLRogram display provides a display having a time axis and a frequency axis in the form of bars spanning the frequency band for each time block with each bar being divided into frequency sub-bands representing a main channel and adjacent side channels, the shading or color of each segment of the bar representing a measurement value for that segment.

The objects, advantages and other novel features of the present invention are apparent from the following detailed description when read in conjunction with the appended claims and attached drawing. dr

DETAILED DESCRIPTION OF THE INVENTION

Figure 1:
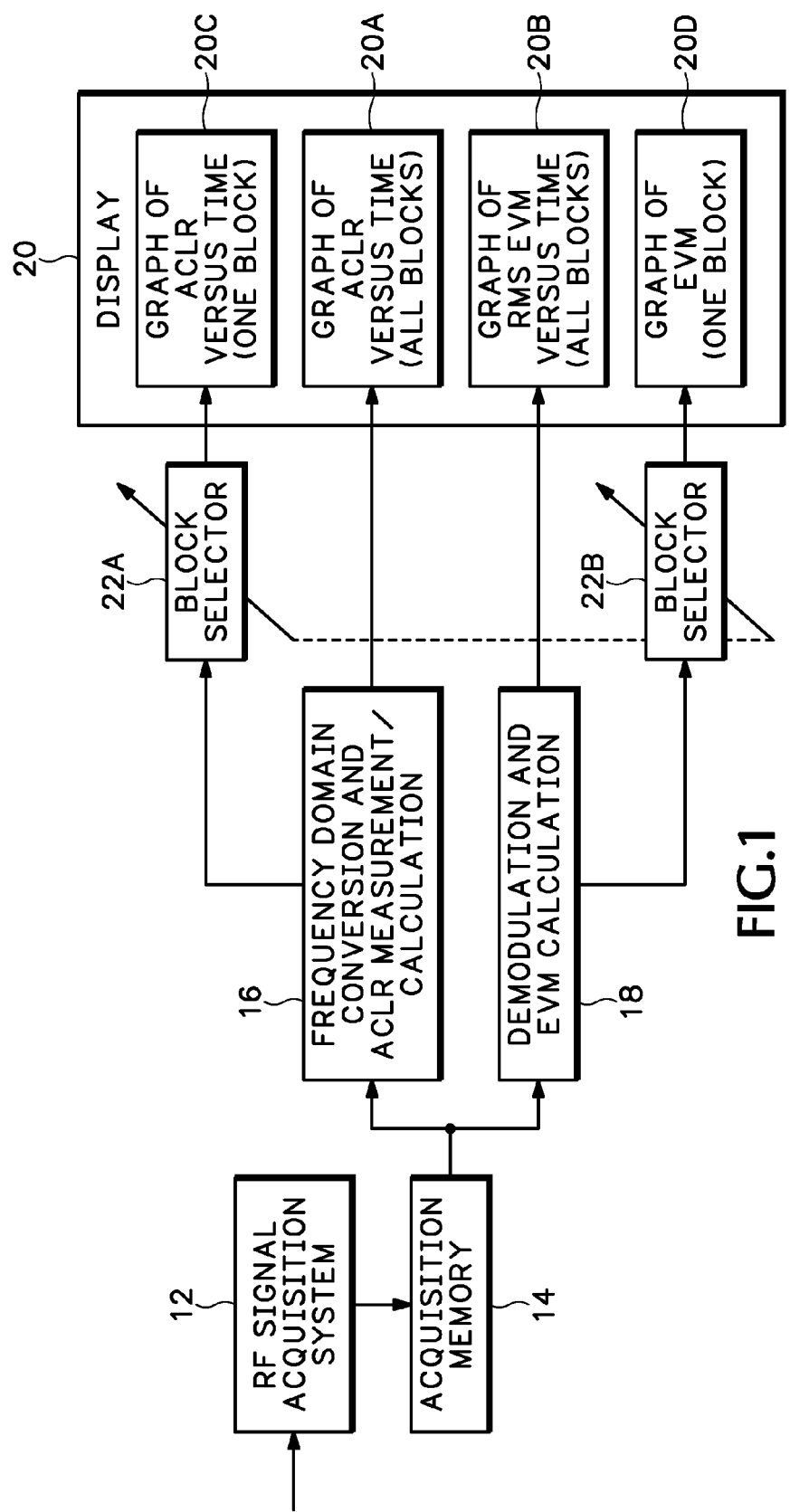
FIG. 1 is a block diagram of a system for time correlation of signal power to distortion characteristics according to the present invention.

Referring now to FIG. 1 a communication signal is input to an RF signal acquisition system 12. The RF signal acquisition system 12 contains software and hardware required to down-convert, digitize and filter the communication or RF signal under test (SUT), such as that disclosed in U.S. Pat. Nos. 4,870,348 and 5,103,402. The digitized SUT is stored in an acquisition memory 14 as a sequence of time domain data samples. The acquisition memory 14 may be of any length, but may be subdivided into a plurality of time "blocks." A time block is a sequence of data samples that is long enough to perform all desired measurements correctly.

The data samples from the acquisition memory 14 are input to a frequency domain calculator 16 and a demodulation calculator 18. The frequency domain calculator 16 converts the data samples from time domain to frequency domain, performs a power and log scale conversion, provides channel filtering appropriate to the bandwidth and type of SUT, and calculates ACLR for each time block. The outputs from the frequency domain calculator 16 are data for a graph of ACLR as a function of time for the entire acquisition memory content and data for individual graphs of ACLR for each time block, which data are input to a display device 20. The demodulation calculator 18 performs a demodulation of the data samples as one time-contiguous entity, calculates EVM from one symbol time to the next, and calculates an RMS EVM value for symbol time periods belonging to each time block of the acquisition. The outputs from the demodulation calculator 18 are data for a graph of RMS EVM as a function of time for the entire acquisition memory content and data for individual graphs of EVM for each time block or symbol time, which data are input to the display device 20. A ganged block selector 22A, 22B assures that the time blocks being displayed for EVM and ACLR are the same time period so that the EVM and ACLR displays are time correlated.

Figure 2:
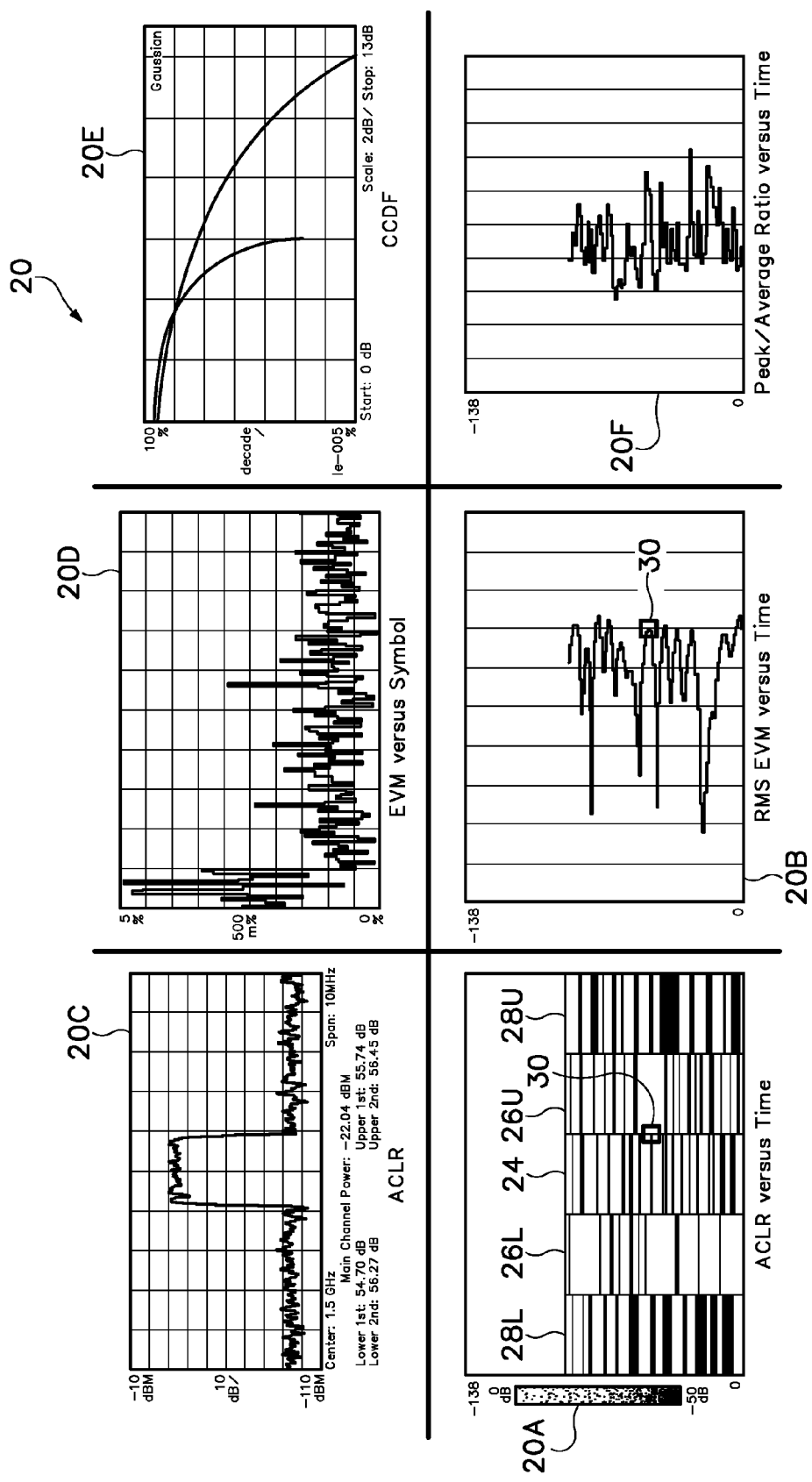
FIG. 2 is a plan view of an illustrative time correlated display of signal power to distortion characteristics according to the present invention.

A typical display is shown in FIG. 2 having multiple display panels 20A, 20B, 20C, 20D, 20E, 20F within the display device 20. The lower left panel 20A provides an "ACLRogram" view of the ACLR measurement over the entire acquisition memory contents, with each horizontal "bar" representing one of the time blocks, and with the frequency spectrum divided into frequency sub-bands representing a main channel 24 and adjacent side channels 26L, 26U, 28L, 28U. The total power in each channel 24, 26, 28 is represented by the color or shading of the horizontal bar. The lower middle panel 20B provides an RMS EVM view over time correlated to the ACLRogram of panel 20A. A correlation marker 30 is shown in the lower left and middle panels 20A, 20B that provides input to the block selectors 22A, 22B as to which time block from the acquisition memory 14 is to be processed and displayed in respective upper panels 20C, 20D. For completeness the right upper and lower panels 20E, 20F show CCDF and PAR for the SUT.

Thus the present invention provides time correlation between measurements in the frequency domain and measurements in the demodulation domain by operating on a common set of time domain data samples acquired for a signal under test, processing the data samples as a sequence of time blocks in both the frequency and demodulation domains, and displaying the resulting measurements in separate panels of a display device with a correlation marker being used to select any particular time block to present both the frequency and demodulation domain results simultaneously in time.

What is claimed is:

1. A method of time correlating signal power to distortion characteristics for a digital signal having multiple sub-bands comprising the steps of:

acquiring time domain data representing the digital signal within a frequency band;

simultaneously converting time slices of the time domain data to frequency and demodulation domain data;

processing the frequency domain data to obtain frequency domain measurements for each time slice;

processing the demodulation domain data to obtain demodulation domain measurements for each time slice; and simultaneously displaying the frequency and demodulation domain measurements as a function of time;

wherein the simultaneously displaying step comprises the steps of:

displaying a first panel within a screen of a display device representing the frequency domain measurements as a function of time based on the time domain data, the first panel having a time axis and a frequency axis with the frequency domain measurements being displayed as frequency sub-band measurements representing a main sub-band from the multiple sub-bands and adjacent side sub-bands, so that the first panel has a series of bars representing the time slices which are divided by the sub-bands, the bars having an indicia for each sub-band representative of the frequency domain measurement for that sub-band and time slice; and displaying a second panel within the screen representing the demodulation domain measurements as a function of time based on the time domain data, the second panel having a time axis corresponding to the time axis of the first panel and having the demodulation domain measurements along a measurement axis so that the frequency and demodulation domain measurements are displayed in time correlation.

2. A method of time correlating signal power to distortion measurements for a digital signal having multiple sub-bands comprising the steps of:

displaying a first panel within a screen of a display device representing a frequency domain measurement as a function of time based on time domain data acquired from the digital signal within a frequency band, the first panel having a time axis and a frequency axis with the frequency domain measurement being performed over individual time slices of the time domain data for the multiple sub-bands within the frequency band, the sub-bands representing a main sub-band and adjacent side sub-bands, so that the first panel has a series of bars representing the time slices which are divided by the sub-bands, the bars having an indicia for each sub-band representative of the frequency domain measurement for that sub-band and time slice; and displaying a second panel within the screen representing a demodulation domain measurement as a function of time based on the time domain data, the second panel having a time axis corresponding to the time axis of the first panel and having the demodulation domain measurement along a measurement axis so that the frequency and demodulation domain measurements are displayed in time correlation.

3. The method as recited in claim 2 further comprising the steps of:

displaying a correlation marker for selecting one of the time slices, the correlation marker being displayed simultaneously on the first and second panels;

displaying a third panel within the screen representing the frequency domain measurement for the time slice selected by the correlation marker; and displaying a fourth panel within the screen representing the demodulation domain measurement for the time slice selected by the correlation marker.

4. The method as recited in claim 2 wherein the indicia comprises one selected from the group consisting of shading and color.

5. A method of displaying frequency and demodulation domain measurements produced by a spectrum analyzer comprising the steps of:

acquiring time domain data representing a digital signal having multiple sub-bands within a frequency band;

simultaneously converting time slices of the time domain data to frequency and demodulation domain data;

processing the frequency domain data to obtain frequency domain measurements for each time slice;

processing the demodulation domain data to obtain demodulation domain measurements for each time slice; and simultaneously displaying the frequency and demodulation domain measurements as a function of time;

wherein the simultaneously displaying step comprises the steps of:

displaying a first panel within a screen of a display device representing the frequency domain measurements as a function of time based on the time domain data, the first panel having a time axis and a frequency axis with the frequency domain measurements being displayed as frequency sub-band measurements representing a main sub-band from the multiple sub-bands and adjacent side sub-bands, so that the first panel has a series of bars representing the time slices which are divided by the sub-bands, the bars having an indicia for each sub-band representative of the frequency domain measurement for that sub-band and time slice; and displaying a second panel within the screen representing the demodulation domain measurements as a function of time based on the time domain data, the second panel having a time axis corresponding to the time axis of the first panel and having the demodulation domain measurements along a measurement axis so that the frequency and demodulation domain measurements are displayed in time correlation.

\* \* \* \* \*